United States Patent
D'Penha et al.

(10) Patent No.: US 10,418,955 B2
(45) Date of Patent: Sep. 17, 2019

(54) PROCESS FOR ACOUSTIC AMPLIFICATION IN A MOBILE DEVICE APPLICATION

(71) Applicant: Language Line Services, Inc., Monterey, CA (US)

(72) Inventors: Lindsay D'Penha, Carmel, CA (US); Jeffrey Cordell, Carmel, CA (US)

(73) Assignee: Language Line Services, Inc., Monterey, CA (US)

( * ) Notice: Subject to any disclaimer, the term of this patent is extended or adjusted under 35 U.S.C. 154(b) by 0 days.

(21) Appl. No.: 15/792,651

(22) Filed: Oct. 24, 2017

(65) Prior Publication Data

US 2018/0294786 A1 Oct. 11, 2018

Related U.S. Application Data

(63) Continuation-in-part of application No. 15/483,455, filed on Apr. 10, 2017.

(51) Int. Cl.
| | |
|---|---|
| *H04R 1/02* | (2006.01) |
| *H03G 3/20* | (2006.01) |
| *H04R 1/28* | (2006.01) |
| *G06F 17/28* | (2006.01) |
| *H04R 1/30* | (2006.01) |
| *H04R 1/34* | (2006.01) |

(52) U.S. Cl.
CPC ............ *H03G 3/20* (2013.01); *G06F 17/289* (2013.01); *H04R 1/026* (2013.01); *H04R 1/2865* (2013.01); *H04R 1/30* (2013.01); *H04R 1/345* (2013.01)

(58) Field of Classification Search
CPC ...... H03G 3/20; G06F 17/289; H04R 1/2865; H04M 7/006; H04M 2203/5063; H04M 15/56; H04M 1/2535; G10L 2015/088; G10L 15/00; G10L 15/02; G10L 2015/228
USPC ........ 381/300–305, 332–334, 336–340, 352, 381/160, 357, 361, 363, 366, 388; 455/416–417; 704/251
See application file for complete search history.

(56) References Cited

U.S. PATENT DOCUMENTS

| | | | | |
|---|---|---|---|---|
| 3,887,771 | A * | 6/1975 | Spanel | H04M 1/2155 379/111 |
| 2008/0086681 | A1* | 4/2008 | Sterns | H04M 3/51 715/236 |
| 2010/0219012 | A1 | 9/2010 | Baumbach | |
| 2013/0052956 | A1* | 2/2013 | McKell | H04R 1/02 455/41.2 |
| 2013/0170686 | A1 | 7/2013 | Lester | |
| 2014/0146877 | A1* | 5/2014 | Delegue | H04N 21/23418 375/240.02 |
| 2016/0057179 | A1* | 2/2016 | Volach | H04L 65/1069 370/261 |

* cited by examiner

*Primary Examiner* — Norman Yu
(74) *Attorney, Agent, or Firm* — Patent Ingenuity, P.C.; Samuel K. Simpson

(57) ABSTRACT

A process is provided. The process receives, at a mobile computing device, audio content via a communication application that provides a voice-based communication between a first user and a second user through a computerized network. Further, the process amplifies, via an acoustic amplification device, the audio content. In addition, the process delivers the audio content through a receptacle that receives the mobile computing device. The receptacle is integrated with the acoustic amplification device.

8 Claims, 17 Drawing Sheets

PROCESS FOR ACOUSTIC AMPLIFICATION IN A MOBILE DEVICE APPLICATION

BACKGROUND

1. Field

This disclosure generally relates to the field of audio delivery. More particularly, the disclosure relates to a receptacle that receives a computing device with an audio delivery component.

2. General Background

With the increasing use of computing devices, various outlets (e.g., stores, shopping centers, conference centers, etc.) provide users with the ability to perform tasks at physical locations through such devices. For instance, kiosks physically situated in stores allow users to purchase items, view account information, provide payment, etc.

Yet, such kiosks are typically limited in the amount of data that can be provided to users in auditory form for a variety of reasons. Firstly, kiosks are typically located in busy areas that are prone to significant amounts of noise; such an environment is not conducive to effectively providing a user with data. To counteract such effects, users may have to have information repeated or may even discontinue use of the kiosk. Secondly, the audio emanating from kiosks is typically so widespread that other users can easily hear data only intended for the user at a kiosk—a significant privacy concern.

As a result, audio delivery components situated at conventional kiosks are ineffective for providing quality audio to users. Therefore, current audio hardware components do not filter noise adequately for an optimal user experience.

In the mobile context, mobile computing devices (e.g., smartphones, tablet devices, smartwatches, etc.) are being increasingly used to provide communication between users over various communication modalities (e.g., voice over IP ("VOIP"), video, etc.). For instance, a software application (local, cloud-based, etc.) used by such mobile computing devices may communicate with systems (e.g., desktops, servers, etc.) or other mobile computing devices.

The software application may be used for chat, social networking, language interpretation, and/or telemedicine. As the users of the software application in such contexts are often situated in environments with significant background noise (e.g., a hospital), the quality of the audio being delivered to, and emanating from, the mobile computing device is often diminished. The recipient of the audio received by a microphone of the mobile computing device often receives an audio signal having the intended audio intermixed with noise, and the recipient of the audio emanating from the speakers of the mobile computing device often cannot hear the audio signal well given the background noise. For example, medical professionals performing telemedicine in a hospital environment often communicate with mobile computing devices mounted on stands that may not be at closes distances to the medical professionals; thereby, allowing for the potential of background noise being intermixed with the intended audio content.

Various software-based solutions have been implemented in current configurations to filter out such intermixed noise. Yet, such software-based solutions are often computationally intensive; as a result, computational resources are expended on software-based filtering processes, which may result in delayed audio provided to the users of such configurations. Further, such software-based solutions often output less than optimal audio quality. For example, parts of a conversation between two users may be inadvertently labeled by software-based solutions as part of the background noise; thereby, being removed from the audio content.

Therefore, software-based solutions may lead to audio delivery delays resulting from slower processing times, diminished audio quality resulting from audio content being deleted, etc. In an environment where communication time and accuracy is paramount (e.g., telemedicine), software-based solutions are often ineffective where significant background noise is possible. Therefore, current audio filtering software configurations do not optimally deliver audio to a user in such contexts.

SUMMARY

A parabolic-shaped receptacle is provided. The parabolic-shaped receptacle has a frame having a left side that has a left parabolic curvature and a right side that has a right parabolic curvature. Further, the parabolic-shaped receptacle has one or more speaker ports. In addition, the parabolic-shaped receptacle has a coupling mechanism that couples a computing device to the frame such that one or more speakers of the computing device are aligned with the one or more speaker ports to deliver audio from the one or more speakers through the one or more speaker ports. The parabolic-shaped receptacle also has a left receptacle speaker positioned on the frame along the left parabolic curvature to the left of the one or more speaker ports. The left receptacle speaker receives the audio from the one or more speaker ports and delivering the audio to one or more users positioned in front of the left parabolic curvature. Further, the parabolic-shaped receptacle has a right receptacle speaker positioned on the frame along the right parabolic curvature to the right of the one or more speaker ports. The right receptacle speaker receives the audio from the one or more speaker ports and delivering the audio to the one or more users positioned in front of the right parabolic curvature.

Alternatively, another parabolic-shaped receptacle is provided. The parabolic-shaped receptacle has a frame having a left side that has a left parabolic curvature and a right side that has a right parabolic curvature. Further, the parabolic-shaped receptacle has a microphone port. In addition, the parabolic-shaped receptacle has a coupling mechanism that couples a computing device to the frame such that a microphone of the computing device is aligned with the microphone port to receive audio from the one or more speakers through the microphone port. The parabolic-shaped receptacle also has a left receptacle speaker positioned on the frame along the left parabolic curvature to the left of the microphone port. The left receptacle speaker receives the audio from one or more users positioned in front of the left parabolic curvature and delivering the audio to the microphone port. In addition, the parabolic-shaped receptacle has a right receptacle speaker positioned on the frame along the right parabolic curvature to the right of the microphone port. The right receptacle speaker receives the audio from one or more users positioned in front of the right parabolic curvature and delivering the audio to the microphone port.

As yet another alternative, another parabolic-shaped receptacle is provided. The parabolic-shaped receptacle has a frame having a left side that has a left parabolic curvature and a right side that has a right parabolic curvature. Further, the parabolic-shaped receptacle has one or more speaker ports. In addition, the parabolic-shaped receptacle has a coupling mechanism that couples a computing device to the frame such that one or more speakers of the computing device are aligned with the one or more speaker ports to deliver audio from the one or more speakers through the one or more speaker ports. The parabolic-shaped receptacle also has a left receptacle speaker positioned on the frame along the left parabolic curvature to the left of the one or more speaker ports. The left receptacle speaker receives the audio from the one or more speaker ports and delivering the audio to one or more users positioned in front of the left parabolic curvature. In addition, the parabolic-shaped receptacle has a right receptacle speaker positioned on the frame along the right parabolic curvature to the right of the one or more speaker ports. The right receptacle speaker receives the audio from the one or more speaker ports and delivering the audio to the one or more users positioned in front of the right parabolic curvature. The parabolic-shaped receptacle also has a left privacy panel. Further, the parabolic-shaped receptacle has a left privacy panel coupling mechanism that couples the left panel to the frame such that the left panel is positioned to deflect audio emanating from the left receptacle speaker toward the one or more users. In addition, the parabolic-shaped receptacle has a right privacy panel. The parabolic-shaped receptacle also has a right privacy panel coupling mechanism that couples the right panel to the frame such that the right panel is positioned to deflect audio emanating from the right receptacle speaker toward the one or more users.

In another aspect of the disclosure, a process is provided. The process receives, at a mobile computing device, audio content via a communication application that provides a voice-based communication between a first user and a second user through a computerized network. Further, the process amplifies, via an acoustic amplification device, the audio content. In addition, the process delivers the audio content through a receptacle that receives the mobile computing device. The receptacle is integrated with the acoustic amplification device.

In yet another aspect of the disclosure, another process is provided. The process receives audio content through a receptacle that receives a mobile computing device. The receptacle is integrated with the acoustic amplification device. Further, the process amplifies, via an acoustic amplification device, the audio content. In addition, the process sends, from the mobile computing device, the amplified audio content via a communication application that provides a voice-based communication between a first user and a second user through a computerized network.

BRIEF DESCRIPTION OF THE DRAWINGS

The above-mentioned features of the present disclosure will become more apparent with reference to the following description taken in conjunction with the accompanying drawings wherein like reference numerals denote like elements and in which.

As an alternative embodiment.

DETAILED DESCRIPTION

A parabolic-shaped receptacle for a computing device is provided to help optimize the audio experience for a user of the computing device. The parabolic-shaped receptacle focuses audio emanating from the computing device toward the user of the computing device and filters out surrounding noise; as a result, the user can effectively listen to the audio emanating from the computing device.

Accordingly, the parabolic-shaped receptacle improves the delivery of audio to the user so that a user can avoid having to provide multiple requests for the same audio data. Further, the privacy of the audio delivery is enhanced as the audio is difficult for others not situated at the audio focal point to hear.

For example, the parabolic-shaped receptacle may be used in a language interpretation/translation environment where privacy of user data may be paramount. For instance, a user speaking a first language (e.g., Spanish) may be unable to communicate effectively with a store representative speaking a second language (e.g., English) at a physical store location. The parabolic-shaped receptacle may be situated in the store to receive a mobile computing device (e.g., a tablet device, smartphone, etc.) that provides remote access to a language interpreter/translator via a computerized network for the user and the store representative; the audio delivery of such access is provided in a focused manner so that only the user and the store representative are effectively able to hear the audio in a filtered manner so that the audio delivery is not intermixed with noise from surrounding customers, representatives, etc.

The example of the parabolic-shaped receptacle being implemented in a store environment for language interpretation/translation is provided only as an example; the parabolic-shaped receptacle may be used in other environments for other purposes. For instance, the parabolic-shaped receptacle may be implemented in shopping centers that are typically noisy environments.

Figure 1A:
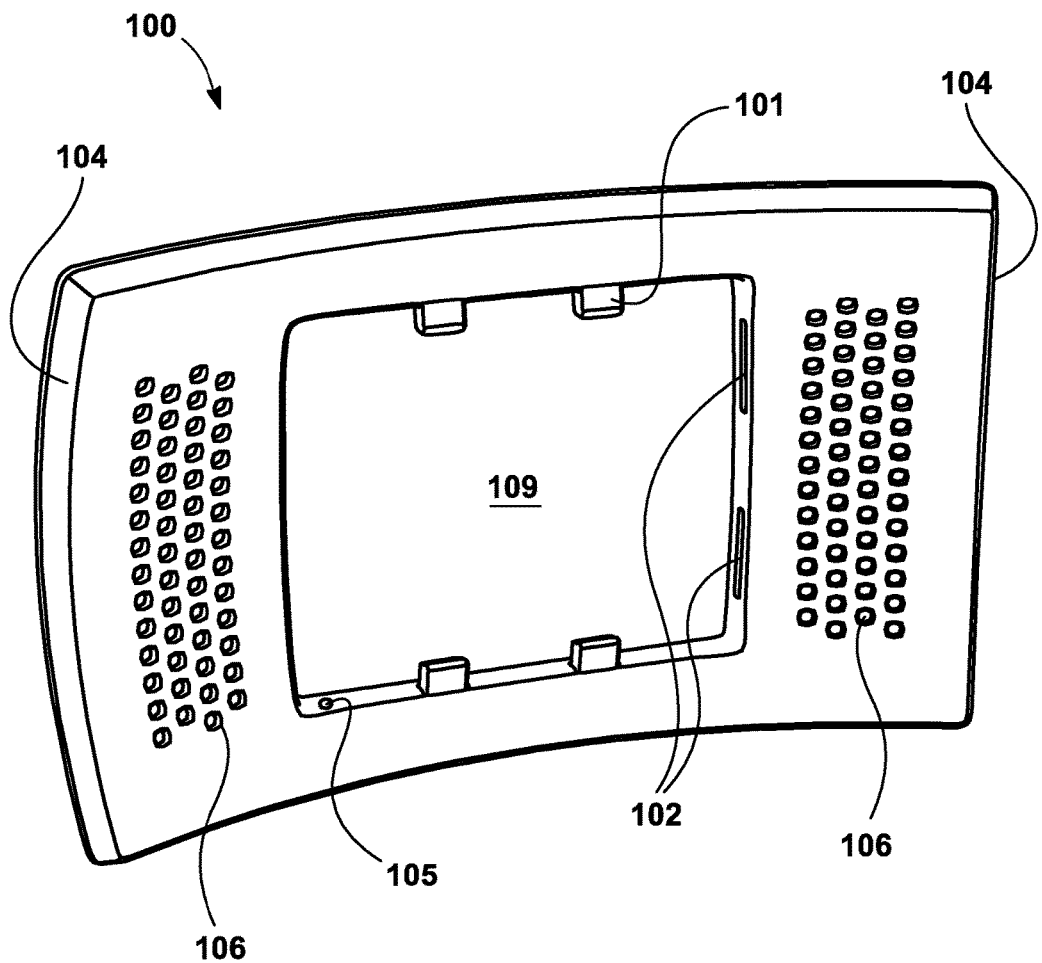
FIG. 1A illustrates a perspective view of a parabolic-shaped receptacle that filters audio emanating from a computing device.
Figure 2A:
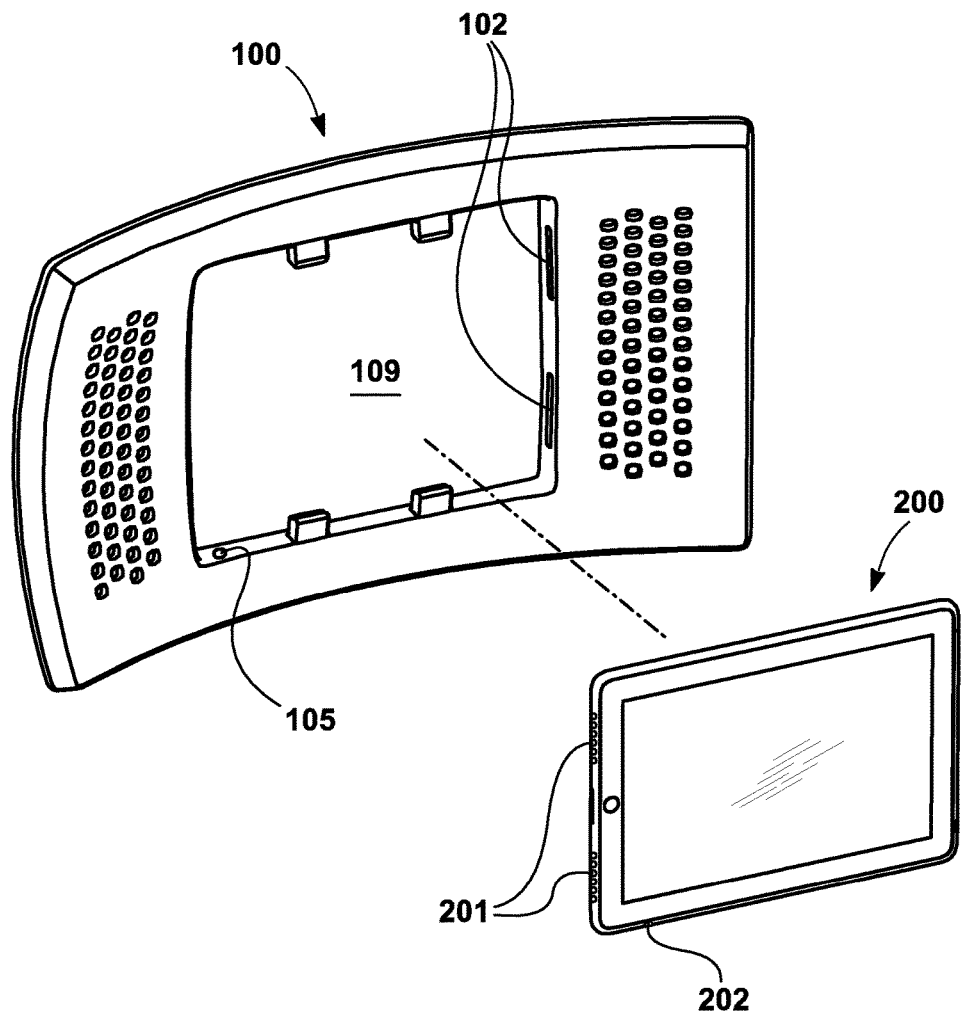
FIG. 2A illustrates a perspective view of the computing device that may be positioned within the parabolic-shaped receptacle illustrated in FIGS. 1A and 1B.

FIG. 1A illustrates a perspective view of a parabolic-shaped receptacle 100 that filters audio emanating from a computing device 200 (FIG. 2A). The parabolic-shaped receptacle 100 has one or more coupling mechanisms 101 (e.g., clips, fasteners, grooves, etc.) that are used to receive and keep the computing device 200 in place in a cavity 109 of the parabolic-shaped receptacle 100. Even though a cavity 109 is illustrated, the one or more coupling mechanisms 101 may be used to couple the computing device 200 to the parabolic-shaped receptacle 100 without the cavity 109 (e.g., via a flat surface, concave surface, convex surface, etc. of the parabolic-shaped receptacle 100).

Further, the parabolic-shaped receptacle 100 has one or more speaker ports 102 that receive audio from the computing device 200; the audio travels through the one or more speaker ports 102 and then through one or more sound tunnels 103 (FIG. 1B) that are shaped according to the parabolic curvature of the parabolic-shaped receptacle 100. The sound tunnels 103 effectively redirect the audio emanating from the computing device 200 (FIG. 2) to one or more users through one or more receptacle speakers 106. For illustration purposes, the receptacle speakers 106 are illustrated as having a plurality of holes but may be implemented without a plurality of holes (e.g., a geometrically-shaped opening that allows sound to emanate from the parabolic-shaped receptacle 100 and obviates cleaning a plurality of smaller holes). The one or more speaker ports 102 may be fully integrated into sides of the cavity 109, partially integrated into the sides of the cavity 109 and partially integrated into the rear of the cavity 109, and/or fully integrated into the rear of the cavity 109 depending on the position of the one or more speakers 201.

In one embodiment, a speaker port 102 surrounds an entirety of speakers 201 (FIG. 2A) of the computing device 200. In another embodiment, the speaker port 102 surrounds only one speaker; therefore, the one or more speaker ports 102 may each be configured to match the size of one or more speakers 201 of the computing device 200. In other words, the one or more speaker ports 102 may be a plurality of small holes that align with a plurality of small speaker ports 102. In yet another embodiment, the one or more speaker ports 102 may be adjusted to slide to different positions for different computing devices 200. For example, the one or more speaker ports 102 may be operably attached to a sliding device so that the one or more speaker ports 102 slide up, down, sideways, to the front, to the rear, etc. to match the position of the one or more speakers 201 of the computing device 200.

Further, a microphone port 105 may surround a microphone 202 (FIG. 2A) of the computing device 200. The audio may then travel inwardly from the users through the receptacle speakers 106 toward the one or more speaker tunnels 103 so that the sound is directed toward the microphone port 105 and then the microphone 202.

In other words, the parabolic-shaped receptacle 100 may be utilized to filter audio that is emanating from the computing device 200 (FIG. 2A) to enhance the listening experience of one or more users situated in front of the parabolic-shaped receptacle 100 or to filter audio that is directed from the one or more users situated in front of the parabolic-shaped receptacle 100 from external noise so that the audio for a recipient of the communication at a remote computing device is filtered.

Even though the parabolic-shaped receptacle 100 is illustrated as being capable of receiving the computing device 200, other embodiments allow for the parabolic-shaped receptacle 100 to have an integrated computing device 200. For example, the parabolic-shaped receptacle 100 may have a built-in computing device 200.

In one embodiment, the parabolic-shaped receptacle 100 also has one or more grips 104 (e.g., grooves) that a user can use to adjust the orientation of the parabolic-shaped receptacle 100. For examples, the grips 104 may be positioned on one or more sides of the curved portions of the parabolic-shaped receptacle 100. The user may then use the grips 104 to turn the parabolic-shaped receptacle 100 to direct the audio emanating from the computing device 200 (FIG. 2A) toward the user; in other words, the user may effectively steer the parabolic-shaped receptacle 100 when connected to a movable stand 300 (FIG. 3).

Figure 1B:
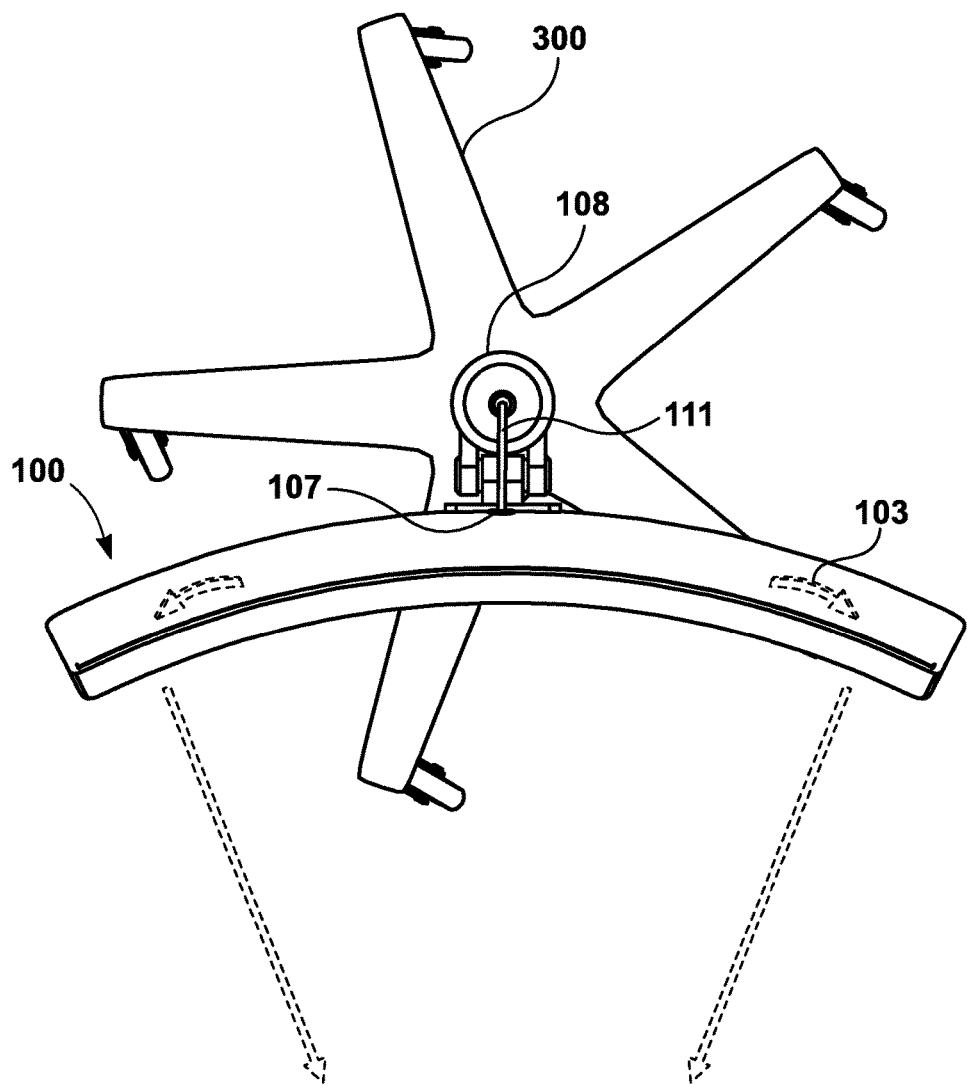
FIG. 1B illustrates a top view of the parabolic-shaped receptacle illustrated in FIG. 1A.

In another embodiment, the parabolic-shaped receptacle 100 has a wire channel 107 that allows for one or more cables 111 to be connected to the parabolic-shaped receptacle 100 without being bent, kinked, etc. For example, the wire channel 107 may be positioned in the rear portion of the parabolic-shaped receptacle 100 as illustrated in FIG. 1B but may also be situated in other areas of the parabolic-shaped receptacle 100 to provide effective and unobtrusive use of wires as needed for operation of the computing device 200 (FIG. 2). The wire channel 107 allows for power cord management; in other words, the wire channel 107 allows the computing device 200 to be powered with a cable 111 permanently installed and not kinked. The cable 111 may be used to provide power, data, communication, etc.

The parabolic-shaped receptacle 100 effectively provides focused and filtered audio (e.g., at a low speaker volume) without use of an external speaker (e.g., a BLUETOOTH speaker). A variety of materials may be used in the construction of the parabolic-shaped receptacle 100 to enhance the audio focusing and filtering aspects of the parabolic-shaped receptacle 100. For example, the parabolic-shaped receptacle 100 may be constructed as a hard plastic shell but other materials may be utilized instead.

FIG. 1B illustrates a top view of the parabolic-shaped receptacle 100 illustrated in FIG. 1A. Arrows are illustrated to depict the bidirectional travel of audio through the one or more speaker tunnels 103. Further, in one embodiment, a stand receiver port 108 is integrated in or attached to the parabolic-shaped receptacle 100 so that a static or movable stand 300 (FIG. 3) may be attached to the parabolic-shaped receptacle 100.

FIG. 2A illustrates a perspective view of the computing device 200 that may be positioned within the parabolic-shaped receptacle 100 illustrated in FIGS. 1A and 1B. The computing device 200 may be mobile (e.g., tablet device, smartphone, etc.) or static (e.g., a kiosk). The mobile configuration allows the computing device 200 to be positioned within the parabolic-shaped receptacle 100 whereas the static configuration allows the parabolic-shaped receptacle 100 to be positioned around the computing device 200 (e.g., as an audio shroud). Further, FIG. 2B illustrates a perspective view of the computing device 200 coupled to the parabolic-shaped receptacle 100.

Figure 3A:
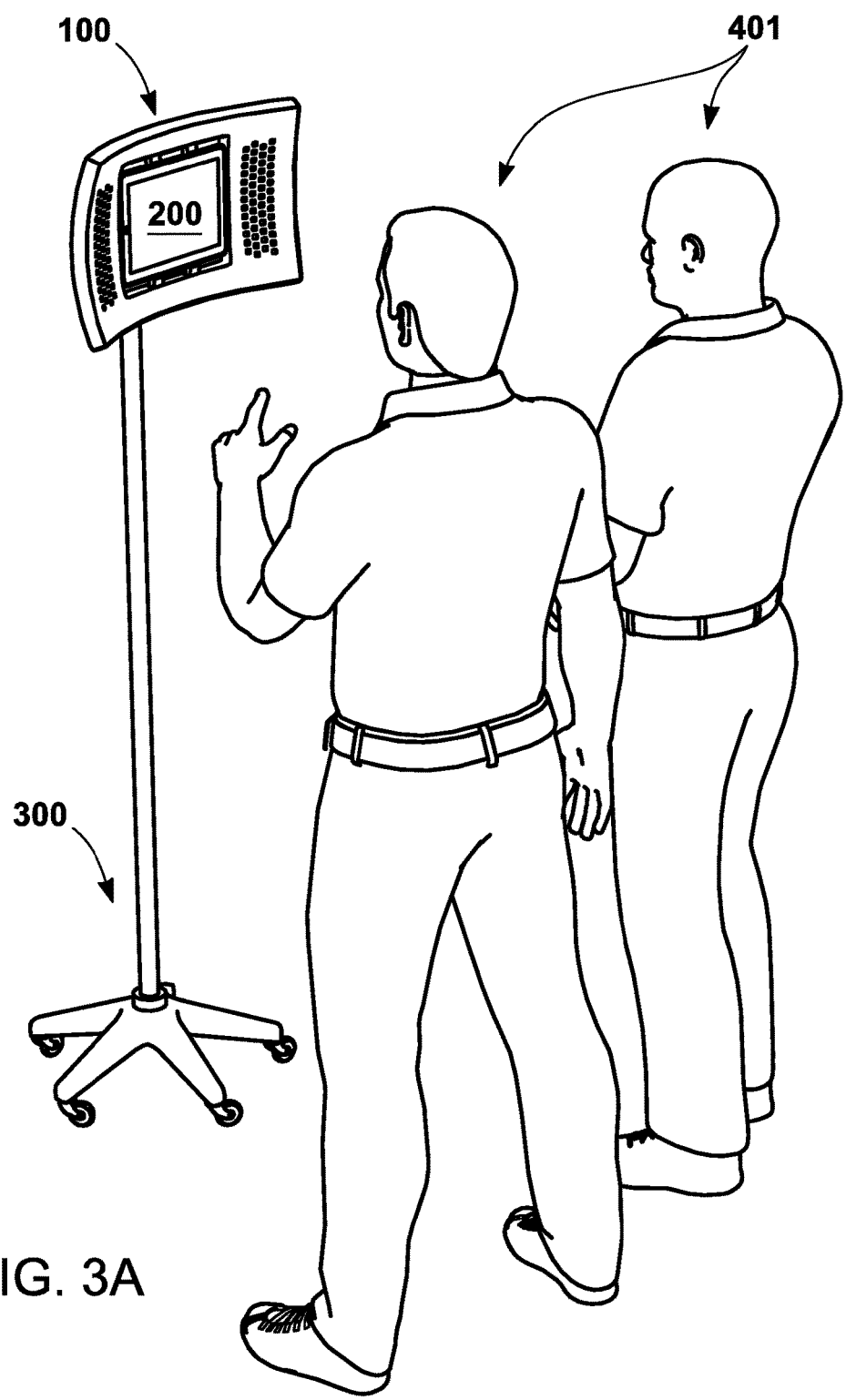
FIG. 3A illustrates perspective view of an example of the movable stand on which the parabolic-shaped receptacle may be positioned.

Further, FIG. 3A illustrates perspective view of an example of the movable stand 300 on which the parabolic-shaped receptacle 100 (FIG. 1A) may be positioned. The movable stand 300 allows one or more users to move the parabolic-shaped receptacle 100 to various positions within a particular environment. Further, the grips 104 (FIG. 1A) may be utilized by the user to steer the parabolic-shaped receptacle 100 to a location at which the all of the intended users are located, a location that is convenient for the users, etc. In addition, the grips 104 may be utilized by the user to adjust the orientation of the parabolic-shaped receptacle 100 for optimal viewing and listening via the computing device 200 (FIG. 2A).

Figure 2B:
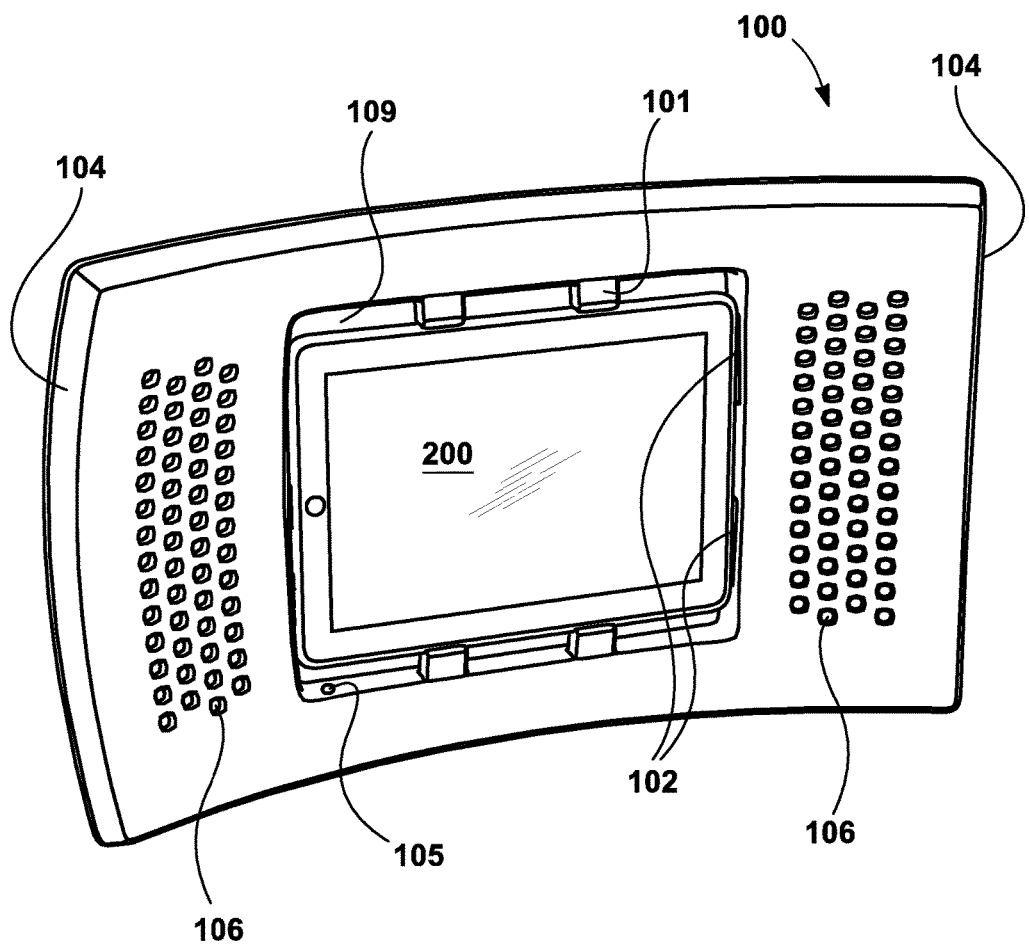
FIG. 2B illustrates a perspective view of the computing device coupled to the parabolic-shaped receptacle.

Further, a plurality of users 401 may use the parabolic-shaped receptacle 100 illustrated in FIGS. 1A and 1B in conjunction with the computing device 200 as illustrated in FIGS. 2A and 2B as situated on the movable stand 300 illustrated in FIG. 3A.

Figure 3B:
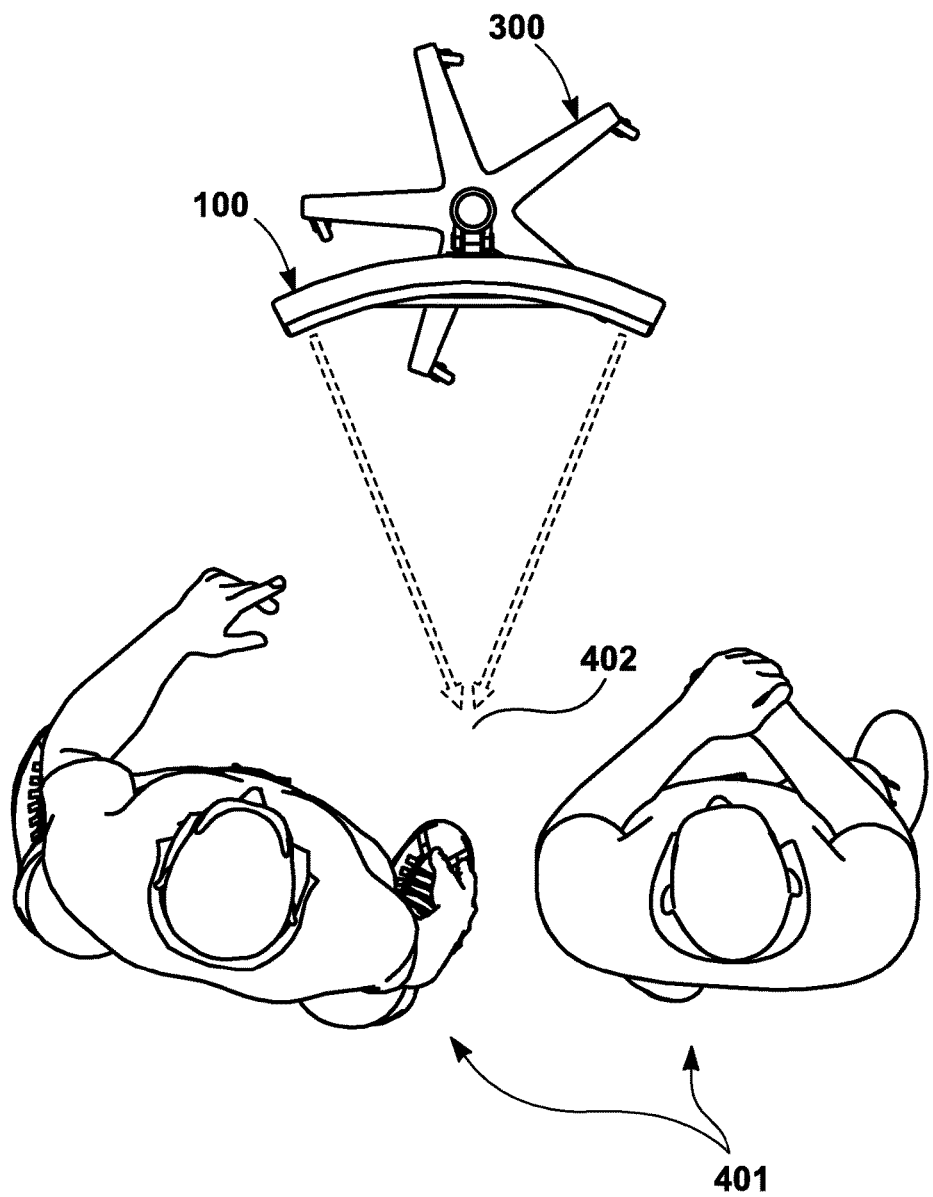
FIG. 3B illustrates a top view of the plurality of users using the parabolic-shaped receptacle via the movable stand as illustrated in FIG. 3A.

FIG. 3B illustrates a top view of the plurality of users 401 using the parabolic-shaped receptacle 100 via the movable stand 300 as illustrated in FIG. 3A. An audio focal point 402 is illustrated at an optimal distance from the parabolic-shaped receptacle 100 (e.g., approximately five feet) to effectively focus the audio emanating from the computing device 200 (FIG. 2A) toward the plurality of users 200.

The parabolic-shaped receptacle 100 may have a variety of parabolic curvatures along different axes to filter noise emanating from the parabolic-shaped receptacle 100 and being received by the parabolic-shaped receptacle 100. For instance, the parabolic-shaped receptacle 100 illustrated in FIG. 1A has two parabolic curvatures: a parabolic curvature around an x-axis (e.g., vertical curvature of corners) and a parabolic curvature around a y-axis (e.g., horizontal curvature illustrated in FIG. 1B).

Figure 4A:
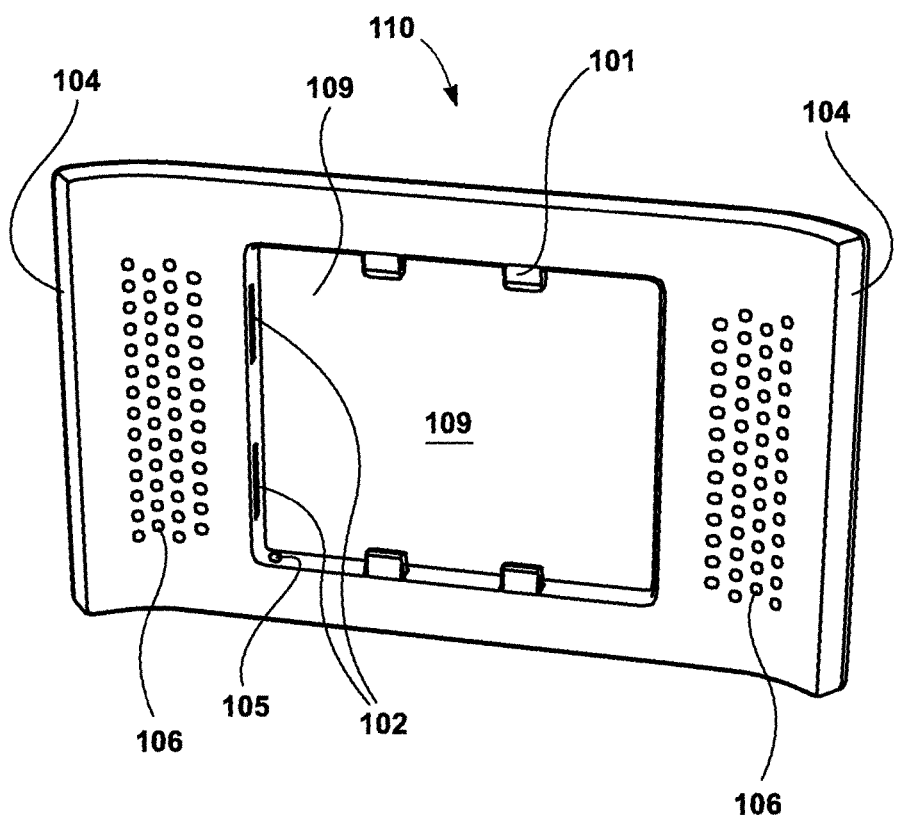
FIG. 4A illustrates a perspective view of a parabolic-shaped receptacle that only has curvature around a y-axis with partially-shaped parabolas.
Figure 4B:
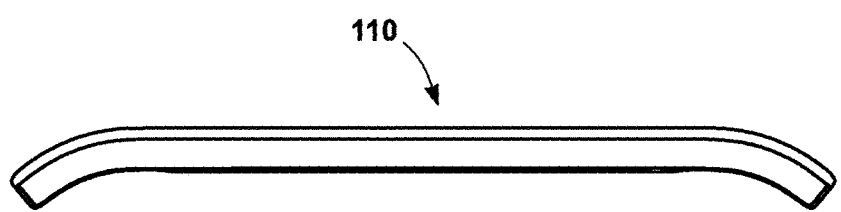
FIG. 4B illustrates at top view of the curvature around the y-axis of the parabolic-shaped receptacle.

As an alternative embodiment, FIG. 4A illustrates a perspective view of a parabolic-shaped receptacle 110 that only has curvature around a y-axis with partially-shaped parabolas. In other words, the corners are not curved toward the user around an x-axis. Further, the parabolic-shaped receptacle 110 may only have curvature for the right and left portions of the parabolic-shaped receptacle 100 such that the portion of the parabolic-shaped receptacle 100 to the rear of the cavity 109 is flat. FIG. 4B illustrates at top view of the curvature around the y-axis of the parabolic-shaped receptacle 110.

Figure 5A:
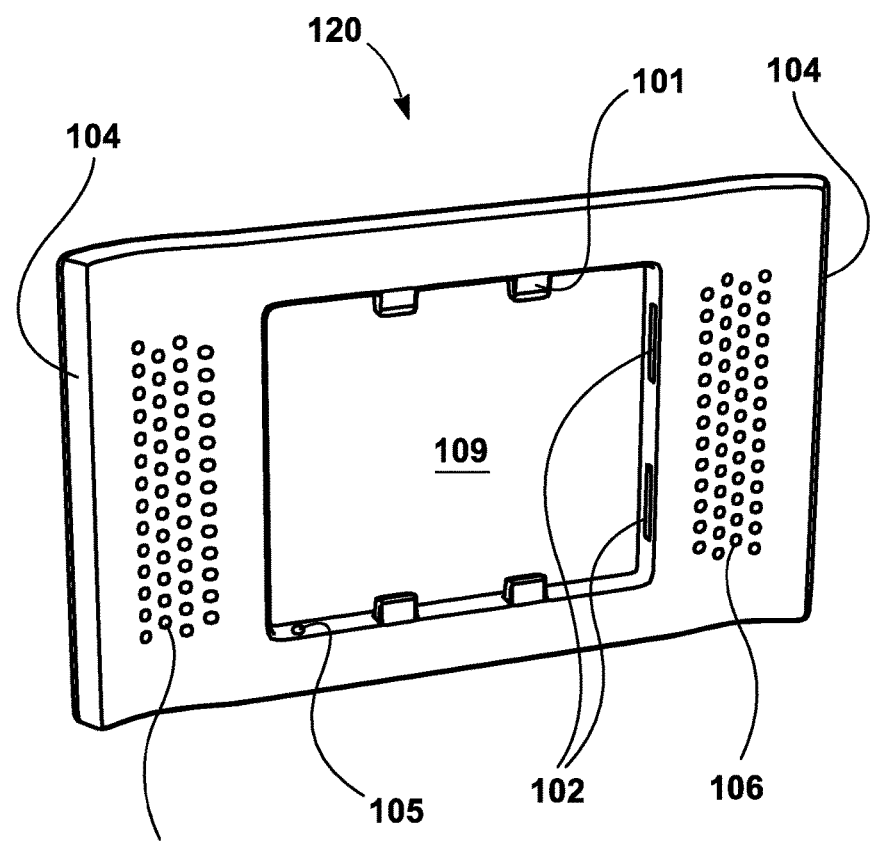
FIG. 5A illustrates a perspective view of a parabolic-shaped receptacle that only has curvature around a y-axis but with fully-shaped parabolas.
Figure 5B:
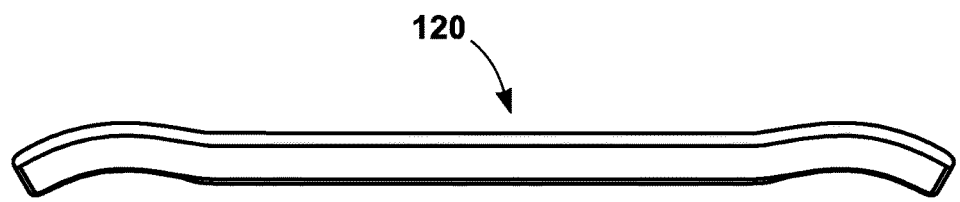
FIG. 5B illustrates at top view of the curvature around the y-axis of the parabolic-shaped receptacle.

As yet another alternative embodiment, FIG. 5A illustrates a perspective view of a parabolic-shaped receptacle 120 that only has curvature around a y-axis but with fully-shaped parabolas. FIG. 5B illustrates at top view of the curvature around the y-axis of the parabolic-shaped receptacle 120.

Figure 5C:
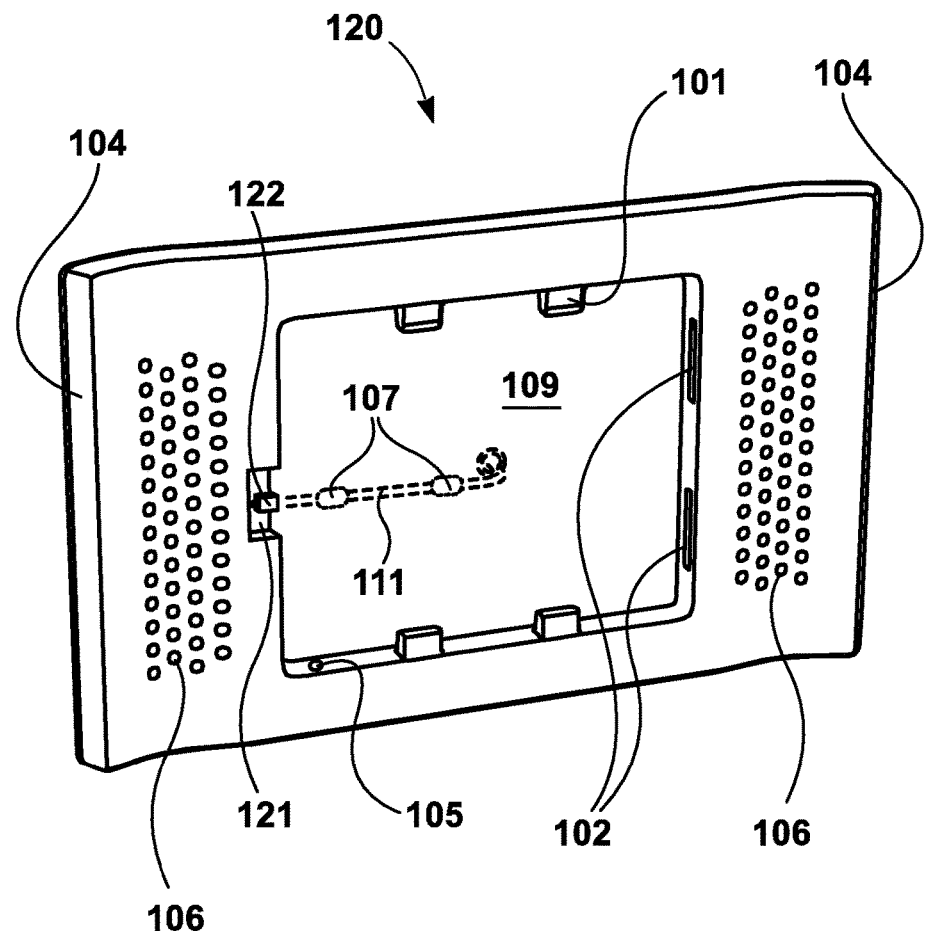
FIG. 5C illustrates a perspective view of an example of a power cord management configuration implemented for the parabolic-shaped receptacle illustrated in FIG. 5A.

Further, FIG. 5C illustrates a perspective view of an example of a power cord management configuration implemented for the parabolic-shaped receptacle 120 illustrated in FIG. 5A. A recess 121 allows for plugging in the cable 111 (FIG. 1B) via a plug 122. Alternatively, an enclosed compartment, which may or may not be capable of being opened, may be used for the plug 122.

Figure 5D:
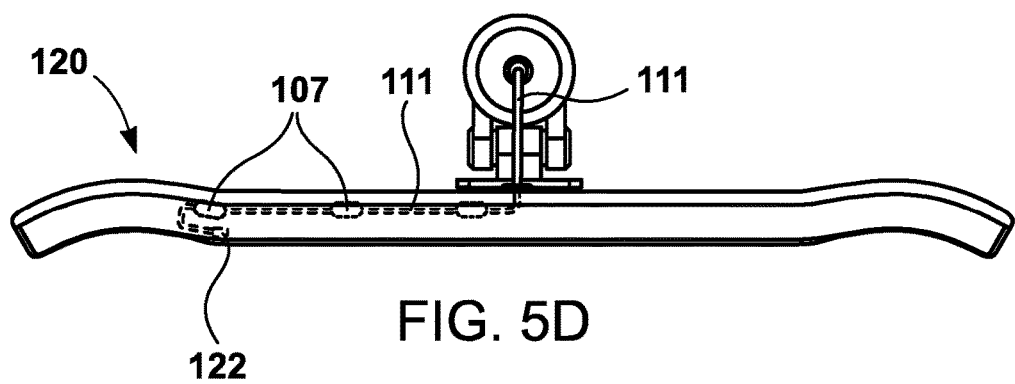
FIG. 5D illustrates a top view of the power cord management configuration illustrated in FIG. 5C.

In addition, FIG. 5D illustrates a top view of the power cord management configuration illustrated in FIG. 5C. The cable 111 enters the parabolic-shaped receptacle 120 externally and is maintained in an unkinked manner (e.g., straight, curved, etc.) in the wire channel 107 after entering the wire channel 107. The cable 111 may then curve after exiting the wire channel 107 to then be plugged into the computing device 200 (FIG. 2A).

The wire channel 107 may be an internal tube, a series of fasteners (e.g., clamps, clips, etc.), or other holding mechanism for maintaining the cable 111 without kinking. As a result, the cable 111 is maintained in an optimal position for operability with minimal wear and tear.

Further, the wire channel 107 may be positioned on the surface of the cavity 109 behind where the computing device 200 (FIG. 2A) is positioned. Alternatively, the wire channel 107 may be positioned beneath a top layer of the cavity 109 on which the computing device 200 is positioned.

The power cord management configuration may be implemented with any of the parabolic-shaped receptacles 100, 110, and 120. For example, the wire channel 107 may conform to the shape of the parabolic-shaped receptacle 100, 110, or 120.

Accordingly, a variety of types of parabolas may be used along different portions of the parabolic-shaped receptacle 120 and around one or more different axes; such variations may be used to provide different types of audio quality to the plurality of users 401.

Figure 6A:
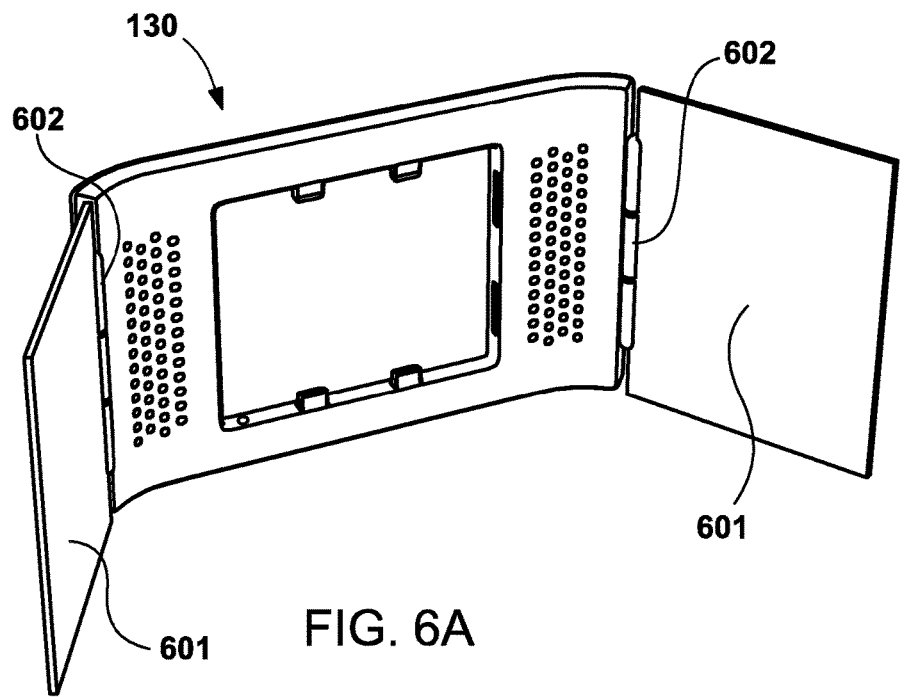
FIG. 6A illustrates a perspective view of a configuration in which an additional device may be integrated in or attached to the any of the parabolic-shaped receptacles to provide additional privacy.

Further, FIG. 6A illustrates a perspective view of a configuration in which an additional device may be integrated in or attached to the any of the parabolic-shaped receptacles 100, 110, and 120 to provide additional privacy. For example, FIG. 6A illustrates a plurality of panels 601 that may be attached to the parabolic-shaped receptacle 130 (FIG. 5A) via one or more hinges 602; accordingly, the plurality of panels 601 may be adjusted (e.g., via inward or outward rotation) to prevent other customers, representatives, etc. from viewing or hearing the content emanating from the computing device 200 (FIG. 2A). Further, the plurality of panels 601 may enhance the focusing and filtering aspects of the audio being delivered to the plurality of users 401 (FIG. 3A). In addition, the plurality of panels 601 may enhance the quality of the audio being delivered from the plurality of users 401 to the computing device 200 (FIG. 2A) by focusing that audio even more toward the computing device 200 and filtering more external noise from surrounding customers, representatives, etc.

The panels 601 may be attached to the parabolic-shaped receptacle 100 via coupling mechanisms (e.g., clips, fasteners, etc.) other than the hinges 602. Further, the panels 601 may move in directions other than the illustrated inward or outward rotation (e.g., folding, extending, retracting, etc.).

Figure 6B:
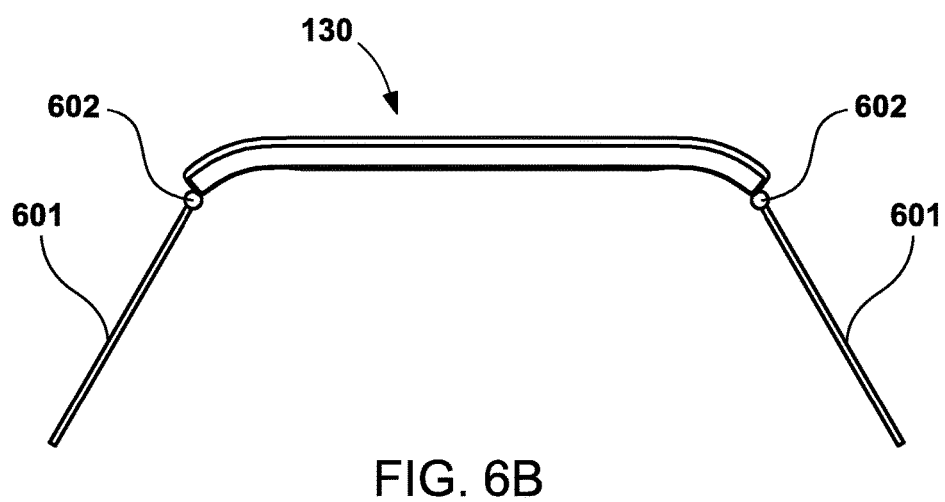
FIG. 6B illustrates a top view of the configuration illustrated in FIG. 6A.
Figure 6C:
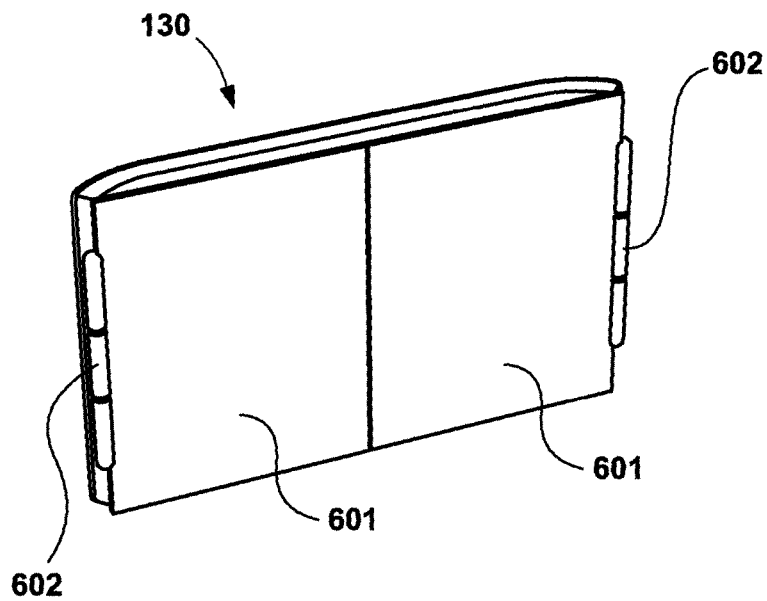
FIG. 6C illustrates a perspective view of the configuration illustrated in FIG. 6A in which the panels are fully rotated inward toward the parabolic-shaped receptacle.
Figure 6D:
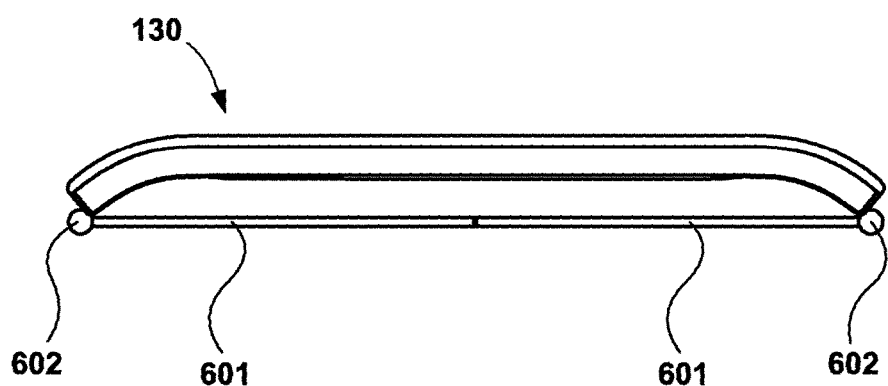
FIG. 6D illustrates a top view of the configuration illustrated in FIG. 6C.

Further, FIG. 6B illustrates a top view of the configuration illustrated in FIG. 6A. FIG. 6C illustrates a perspective view of the configuration illustrated in FIG. 6A in which the panels 601 are fully rotated inward toward the parabolic-shaped receptacle 130; such positioning of the panels 601 may provide a screen cover to detect a hibernation mode for the computing device 200. In addition, FIG. 6D illustrates a top view of the configuration illustrated in FIG. 6C.

In another embodiment, an acoustic amplification process is provided for a mobile computing device that executes a software application. The acoustic amplification process amplifies outbound audio that emanates from one or more speakers of the mobile computing device. In addition, or in the alternative, the acoustic amplification process amplifies inbound audio that is provided from a user through an audio input device (e.g., microphone) of the mobile computing device through a network to a recipient user.

In contrast with software-based solutions, the acoustic amplification process implements an acoustic hardware component to amplify inbound and/or outbound audio content through a mobile computing device. Accordingly, the acoustic amplification process obviates reliance on software-based solutions to remove background noise audio. In other words, the acoustic amplification process improves the functioning of a computer by reducing the processing time of a processor of the mobile computing device to filter out background noise. The processor of the mobile computing device may send and receive audio without performing a software-based filtering process. As a result, the processor may immediately send and receive audio to users; thereby, reducing the typical delay in audio delivery time. Further, the quality of the audio delivered by the acoustic amplification process is improved as portions of the audio content are not deleted, which thereby removes the possibility of inadvertently labeling parts of a conversation as background noise for deletion. Rather, the portions of the conversation are enhanced via utilization of acoustic hardware. The amplified audio diminishes the background noise so that the users are able to send and receive quality audio for the conversation.

Figure 7A:
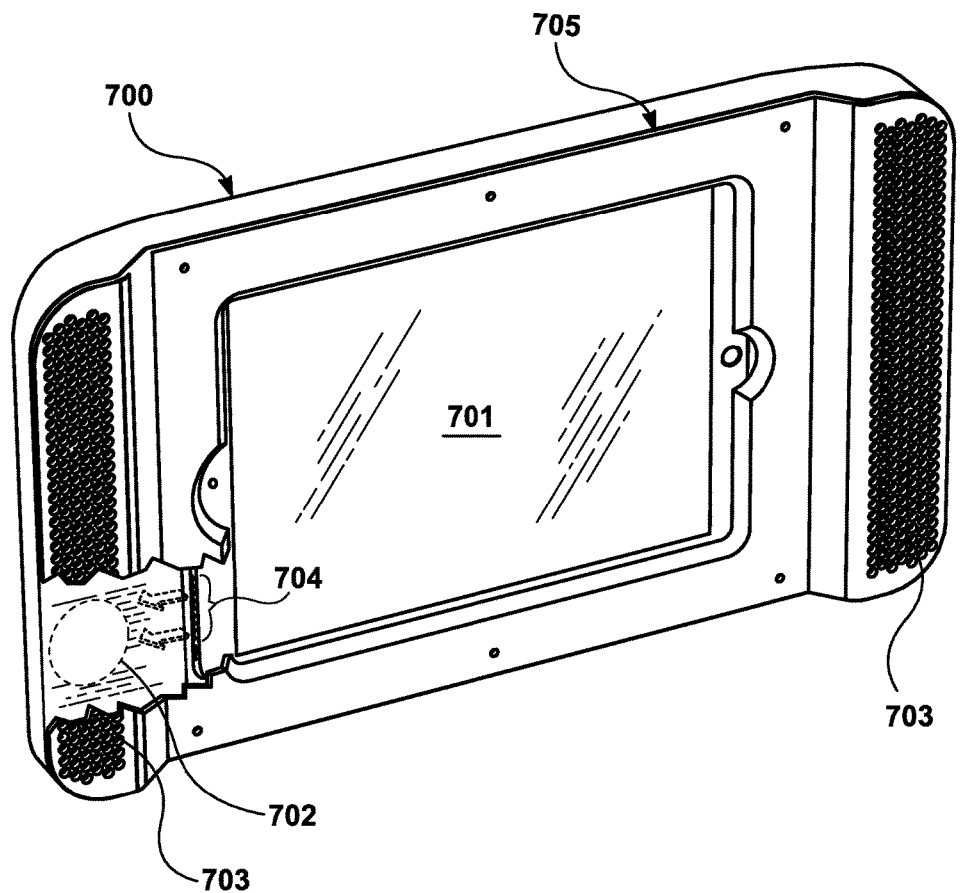
FIG. 7A illustrates a receptacle configuration that implements the acoustic amplification process.

FIG. 7A illustrates a receptacle configuration that implements the acoustic amplification process. A receptacle 700 may receive a mobile computing device 701 situated between the receptacle 700 and a front plate 705. For instance, the receptacle 700 may have various connectors (e.g., clips) that adhered the mobile computing device 701 to the receptacle 700. Alternatively, the receptacle 700 may be disassembled to allow for positioning of the mobile computing device 701 within the receptacle 700 and then reassembled for enclosure of the mobile computing device 701. The receptacle 700 may have various speaker ports that may align with one or more audio speakers of the mobile computing device 701; the audio from the audio speakers may then be funneled through the speaker ports through one or more internal waveguides in the receptacle 700 to an acoustic amplification device 702.

In other words, the audio emanating from the one or more audio speakers of the mobile computing device 701 may be funneled to the acoustic amplification device 702 for amplification through one or more speaker hole arrangements 703.

Figure 7B:
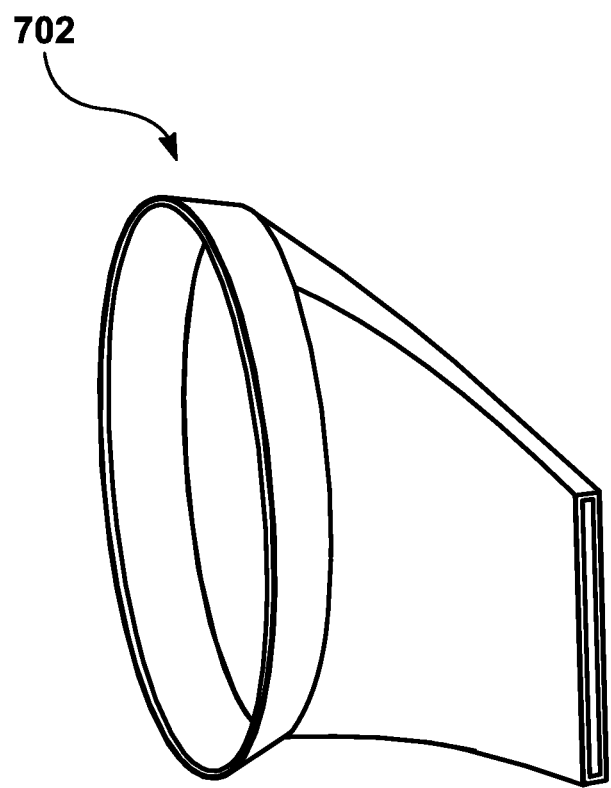
FIG. 7B illustrates a magnified view of the acoustic amplification device.

FIG. 7B illustrates a magnified view of the acoustic amplification device 702. As an example, the acoustic amplification device 702 may be an acoustic horn. For instance, the acoustic amplification device 702 may provide an acoustic impedance match between a sound source and free air; as a result, the efficiency by which audio waves from the audio source are transferred to air is maximized. Even though an ellipse is illustrated for the shape of the acoustic horn, other sizes and shapes may be used for the acoustic horn. Further, other types of acoustic amplification devices with varying shapes and sizes may be used instead.

As is apparent from FIGS. 7A and 7B, the audio emanating from the one or more speakers of the mobile computing device 701 may emanate at an angle from the one or more speakers 704 to and through one or more speaker hole arrangements 703 since the one or more speaker hole arrangements 703 may not be situated directly over the one or more speakers of the mobile computing device 701. For example, the audio content may be delivered through a speaker hole arrangement 703 of the receptacle 700 that is situated at an angle between one degree and one hundred eighty degrees with respect to the one or more speakers of the mobile computing device.

Figure 8:
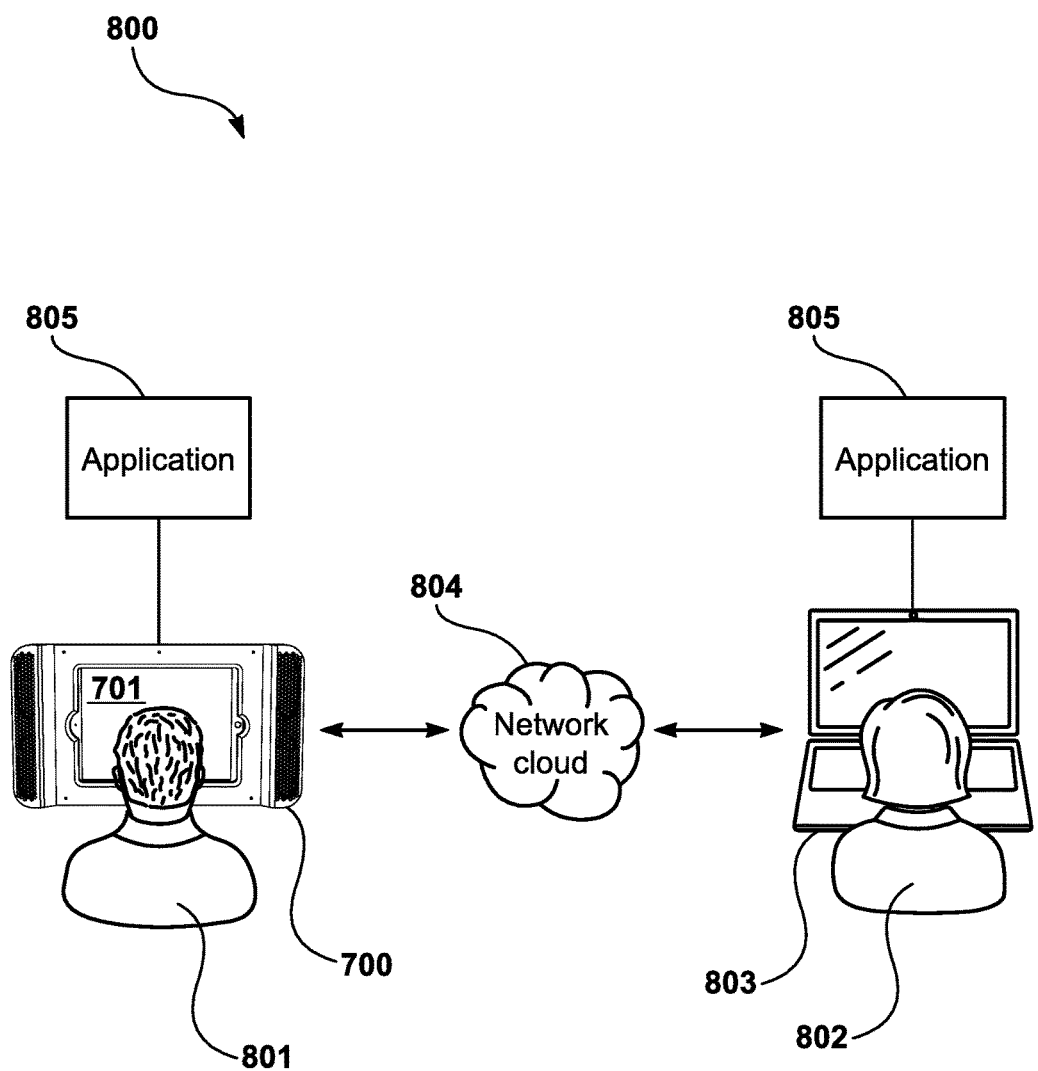
FIG. 8 illustrates a system configuration that implements the acoustic amplification process.

FIG. 8 illustrates a system configuration 800 that implements the acoustic amplification process. The mobile computing device 701 (FIGS. 7A and 7B) may be utilized by a first user 801 in conjunction with the receptacle 700 to communicate with a second user 802 at a computing device 803 through a computerized network 804. Each of the mobile computing device 701 and the computing device 803 has stored thereon, or access via a cloud-based system to, a communication application 805. In one embodiment, the computing device 803 is desktop-based system or other static system. In yet another embodiment, the computing device 803 is a mobile computing device.

The communication application 805 may be VoIP-based, telemedicine-based, a social networking application, message-based, a video communication application, a teleconferencing application, spoken language interpretation application (e.g., an interpreter translating a voice-based conversation in real-time, or substantially real-time from a first spoken language such as English into a second spoken language such as Spanish), etc. In other words, the communication application 805 allows the first user 801 and the second user 802 to communicate in a voice-based conversation, respectively, via the mobile computing device 701 and the computing device 803.

Figure 9:
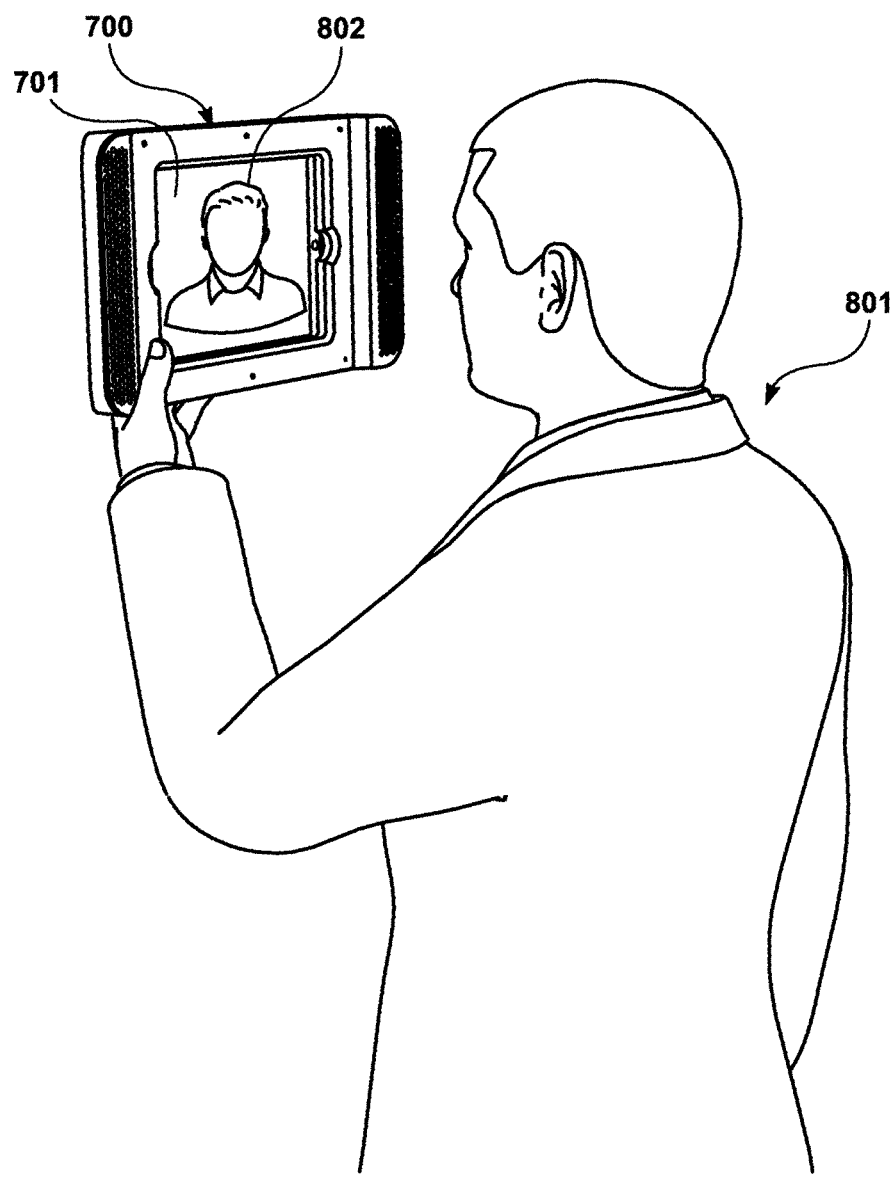
FIG. 9 illustrates an example of the acoustic amplification process being used by the first user and the second user illustrated in FIG. 8.

FIG. 9 illustrates an example of the acoustic amplification process being used by the first user 801 and the second user 802 illustrated in FIG. 8. A display screen 901 depicts an image of the second user 802. For example, the first user 801 and the second user 802 may be participating in a video teleconference via the communication application.

The acoustic amplification device 702 amplifies the audio spoken by the second user 802 so that the first user 801 may listen to the audio content even in the presence of surrounding background noise. Further, the processing time for such audio delivery is reduced as the processor used by the mobile computing device 701 does not have to perform audio filtering.

Figure 10:
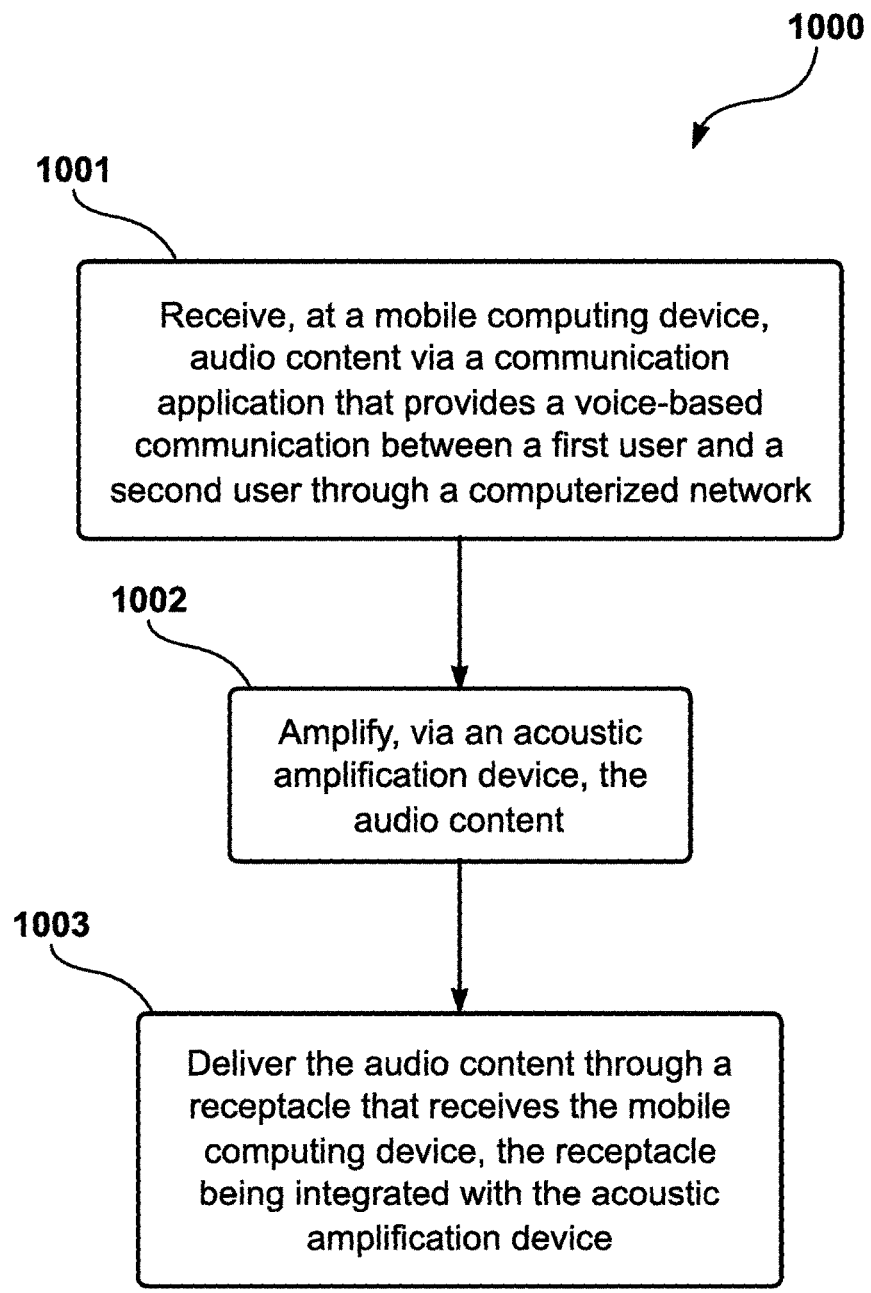
FIG. 10 illustrates a process that may be used to perform inbound acoustic amplification.

FIG. 10 illustrates a process 1000 that may be used to perform inbound acoustic amplification. At a process block 1001, the process 1000 receives, at a mobile computing device 701 (FIG. 7), audio content via a communication application 805 (FIG. 8) that provides a voice-based communication between a first user 801 and a second 802 user through a computerized network 804. Further, at a process block 1002, the process 1000 amplifies, via an acoustic amplification device 702, the audio content. In addition, at a process block 1003, the process 1000 delivers the audio content through the receptacle 700 that receives the mobile computing device 701. The receptacle 700 is integrated with the acoustic amplification device 702.

Figure 11:
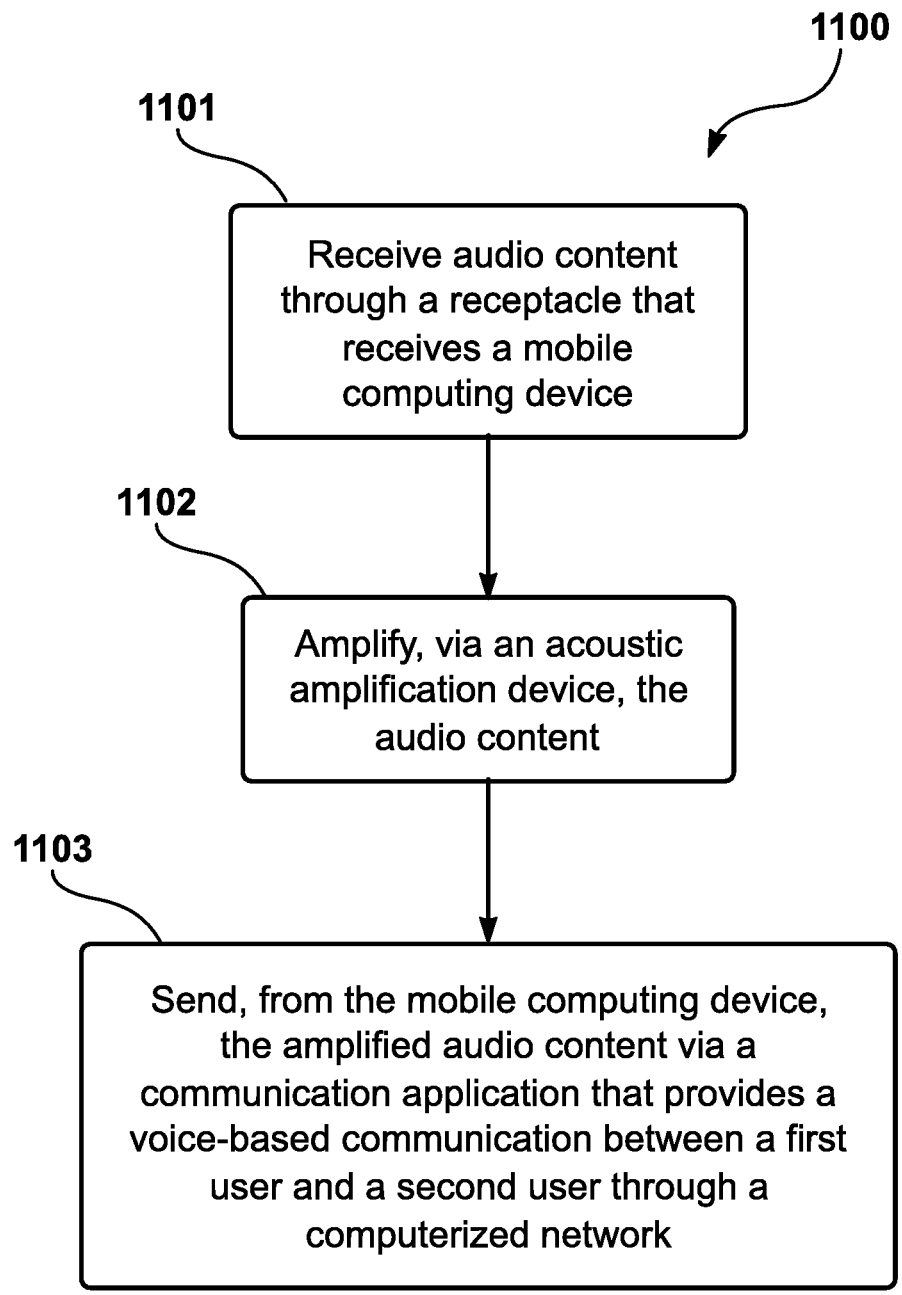
FIG. 11 illustrates a process that may be used to perform outbound acoustic amplification.

Further, FIG. 11 illustrates a process 1100 that may be used to perform outbound acoustic amplification. At a process block 1101, a process 1100 receives audio content through the receptacle 700 (FIG. 7) that receives the mobile computing device 701. The receptacle 700 is integrated with the acoustic amplification device 702. Further, at a process block 1102, the process 1100 amplifies, via an acoustic amplification device 702, the audio content. In addition, at a process block 1103, the process 1100 sends, from the mobile computing device 701, the amplified audio content via the communication application 805 that provides a voice-based communication between the first user 801 and the second user 802 through the computerized network 804.

Further enhancements to the emanation and delivery of the audio quality to the configurations provided for by FIGS. 7A-11 may result when such configurations are used in conjunction with the configurations provided for by FIGS. 1A-6B. For example, parabolic curvature of the receptacle and/or panels may further improve the audio quality.

A computer is herein intended to include any device that has a general, multi-purpose or single purpose processor as described above. For example, a computer may be a PC, laptop computer, set top box, cell phone, smartphone, tablet device, smart wearable device, portable media player, video player, etc.

It is understood that the apparatuses described herein may also be applied in other types of apparatuses. Those skilled in the art will appreciate that the various adaptations and modifications of the embodiments of the apparatuses described herein may be configured without departing from the scope and spirit of the present computer apparatuses. Therefore, it is to be understood that, within the scope of the appended claims, the present apparatuses may be practiced other than as specifically described herein.

We claim:

1. A process comprising:

receiving audio content through a plurality of speaker ports of a receptacle, the plurality of speaker ports each aligning with an audio speaker of a mobile computing device that is received by the receptacle to emanate additional audio content, the receptacle having a top edge, a bottom edge, a right section, and a left section that surround a cavity in which the mobile computing device is received, the top edge being coplanar with the bottom edge, the receptacle being integrated with an acoustic amplification device within at least one of the right section and the left section, the acoustic amplification device having a waveguide that is directed toward a microphone port of the receptacle, the microphone port surrounding a microphone of the mobile computing device;

amplifying, via the acoustic amplification device, the audio content by funneling the audio content through the waveguide for delivery to the microphone through the microphone port; and sending, from the mobile computing device to a recipient communication device, the amplified audio content via a communication application that provides a voice-based communication between a first user and a second user through a computerized network.

2. The process of claim 1, wherein the communication application is VoIP-based.

3. The process of claim 1, wherein the communication application is telemedicine-based.

4. The process of claim 1, wherein the communication application provides spoken language interpretation between a first spoken language and a second spoken language.

5. The process of claim 1, wherein the communication application is a social networking application.

6. The process of claim 1, wherein the communication application is message-based.

7. The process of claim 1, wherein the communication application is based on video communication.

8. The process of claim 1, wherein the acoustic amplification device is an acoustic horn.

* * * * *